(12) United States Patent
Arutinov et al.

(10) Patent No.: US 10,304,797 B2
(45) Date of Patent: May 28, 2019

(54) APPARATUS AND METHOD FOR SOLDERING A PLURALITY OF CHIPS USING A FLASH LAMP AND A MASK

(71) Applicant: Nederlandse Organisatie voor toegepast-natuurwetenschappelijk onderzoek TNO, 's-Gravenhage (NL)

(72) Inventors: Gari Arutinov, 's-Gravenhage (NL); Edsger Constant Pieter Smits, 's-Gravenhage (NL); Jeroen van den Brand, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 5 days.

(21) Appl. No.: 15/570,036

(22) PCT Filed: Apr. 26, 2016

(86) PCT No.: PCT/NL2016/050295
§ 371 (c)(1),
(2) Date: Oct. 27, 2017

(87) PCT Pub. No.: WO2016/175653
PCT Pub. Date: Nov. 3, 2016

(65) Prior Publication Data
US 2019/0027461 A1   Jan. 24, 2019

(30) Foreign Application Priority Data
Apr. 28, 2015  (EP) .................................... 15165482

(51) Int. Cl.
*H01L 23/00* (2006.01)
*H05K 3/34* (2006.01)
*H01L 21/683* (2006.01)

(52) U.S. Cl.
CPC .......... *H01L 24/75* (2013.01); *H01L 21/6836* (2013.01); *H01L 24/11* (2013.01);
(Continued)

(58) Field of Classification Search
CPC ......... H01L 24/11; H01L 24/13; H01L 24/14; H01L 24/16; H01L 24/17; H01L 24/75;
(Continued)

(56) References Cited

U.S. PATENT DOCUMENTS

2006/0060979 A1    3/2006  Frutschy
2006/0264022 A1*  11/2006  Sugimura ............. H01L 21/563
                                                                   438/613
2013/0256864 A1   10/2013  Nagano et al.

FOREIGN PATENT DOCUMENTS

JP           2004241689 A       8/2004

OTHER PUBLICATIONS

Database WPI, Week 200868, Thomas Scientific, London, GB; AN-2008-L65728, XP002748693 & KR 100 820 741 B1 (1 page) (Samsung Electronics Co., Ltd.) (Apr. 11, 2008).
(Continued)

*Primary Examiner* — Hoai V Pham
(74) *Attorney, Agent, or Firm* — Leydig, Voit & Mayer, Ltd.

(57) ABSTRACT

An apparatus and method for soldering chips to a substrate. A substrate and two or more different chips having different heating properties are provided. A solder material is disposed between the chips and the substrate. A flash lamp generates a light pulse for heating the chips, wherein the solder material is at least partially melted by contact with the heated chips. A masking device is disposed between the flash lamp and the chips causing different light intensities in different areas of the light pulse passing the masking device thereby heating the chips with different light intensities. This
(Continued)

may compensate the different heating properties to reduce a spread in temperature between the chips as a result of the heating by the light pulse.

15 Claims, 7 Drawing Sheets

(52) U.S. Cl.
CPC .............. *H01L 24/81* (2013.01); *H01L 24/97* (2013.01); *H05K 3/3436* (2013.01); *H05K 3/3494* (2013.01); *H01L 24/13* (2013.01); *H01L 24/16* (2013.01); *H01L 2221/68354* (2013.01); *H01L 2224/131* (2013.01); *H01L 2224/8119* (2013.01); *H01L 2224/8123* (2013.01); *H01L 2224/81224* (2013.01); *H01L 2224/81815* (2013.01); *H01L 2224/97* (2013.01)

(58) Field of Classification Search
CPC ....... H01L 24/81; H01L 24/97; H05K 3/3436; H05K 3/3494
See application file for complete search history.

(56) References Cited

OTHER PUBLICATIONS

Van Den Ende et al., "Photonic Flash Soldering of Thin Chips and SMD Components on Foils for Flexible Electronics," IEEE Transactions on Components, Packaging and Manufacturing Technology, vol. 4, No. 11, pp. 1879-1886 (Nov. 2014).

Van Den Ende et al, "Large Area Photonic Flash Soldering of Thin Chips on Flex Foils for Flexible Electronic Systems: In Situ Temperature Measurements and Thermal Modelling," Electron, Mater. Lett., vol. 10, No. 6, pp. 1175-1183 (Nov. 10, 2014).

European Patent Office, International Search Report in corresponding International Application No. PCT/NL2016/050295 dated Nov. 2, 2016 (9 pages).

* cited by examiner

APPARATUS AND METHOD FOR SOLDERING A PLURALITY OF CHIPS USING A FLASH LAMP AND A MASK

CROSS-REFERENCE TO RELATED APPLICATIONS

This patent application is a U.S. National Phase of PCT International Application No. PCT/NL2016/050295, filed Apr. 26, 2016, which claims priority to European Application No. 15165482.9, filed Apr. 28, 2015, which are both expressly incorporated by reference in their entireties, including any references contained therein.

TECHNICAL FIELD AND BACKGROUND

The present disclosure relates to soldering, in particular to an apparatus and method for soldering chips to a substrate.

Simple flexible systems, such as logic functions with transistors or optoelectronic devices, can in principle be fully printed on a substrate (e.g. foil or rigid board). However, for more complex systems, there is a need to develop hybrid systems in which printed circuitry is combined with silicon-based integrated circuits or surface mounted device (SMD) components, referred herein as chip components or simply "chips". To functionalize the device, multiple chip components, often having different dimensions, may need to be interconnected to the circuit tracks on the substrate, e.g. printed or etched copper circuits. This can be realized for example using oven reflow soldering, conducting adhesive bonding or face-up chip integration. However, these processes are considered time consuming and/or incompatible with low-cost foils having low decomposition temperatures.

For example, reflow soldering can typically be used for interconnecting thick chips on a rigid substrate board. However, reflow soldering, is poorly compatible with low-cost flexible foils and roll-to-roll (R2R) processing because it requires maintaining the whole board above the liquidus temperature of the solder for long holding time. This can result in a time-consuming process using large in-line ovens, often having multiple loops. The long holding time may also cause deformation or degradation of the flexible foil itself or degradation of its organic surface coatings or adhesives. It can even be impossible to oven reflow solder on low-cost foils, such as polyethylene terephthalate (PET), by using industry standard lead-free alloys because PET has a maximum processing temperature of around 120° C.-150° C., which is much lower than the liquidus temperature of these solders (>200° C.).

As an alternative, for example, infrared (IR) heating can be used with comparable soldering time. For example, infrared laser spots can be used to heat each solder connection sequentially. However, in laser spot soldering, the small spot area may require precise positioning of the spot for each component. Furthermore, applying this technology in a R2R process is challenging as the laser spot needs to align to multiple chips on a moving substrate. Furthermore, the process can be time consuming.

As another alternative, large area illumination by a high-energy light pulse of a flash lamp can be used. For example, an article in Electronic Materials Letters, Vol. 10, No. 6 (2014), pp. 1175-1183 by Van den Ende et al. describes Large area photonic flash soldering of thin chips on flex foils for flexible electronic systems. Advantageously, when the timescale of the heating pulse is short enough to avoid diffusive heating of the flexible polymer substrate, components can be soldered at temperatures higher than the maximum processing temperature of the foils. However, if the absorption of light by the (foil) substrate and/or components differs, this can lead to selective heating. Furthermore, electronic devices generally consist of multiple chip components. This may lead to further differences in heating behaviour for the different components, which makes the temperature and solder process difficult to control.

Accordingly, there remains a need for improvement in the soldering of chips to a substrate, e.g. faster, more reliable, compatible with flexible foil substrates, roll-to-roll processing, and different chips and/or substrates.

SUMMARY

Aspects of the present disclosure may be embodied as a method for soldering chips to a substrate. The method comprises providing a substrate and two or more different chips typically having different heating properties, e.g. caused by different dimensions (surface area and/or thickness), heat capacity, absorptivity, conductivity, number and/or size of solder bonds, etcetera. A solder material is disposed between the chips and the substrate. For example the solder material can be provided on the substrate where the chips are to be placed, at an underside of the chips, or both. The method comprises providing a flash lamp generating a light pulse for heating the chips. The solder material is at least partially melted (soldered) by contact with the heated chips. A masking device is disposed between the flash lamp and the chips causing different light intensities in different areas of the light pulse passing the masking device. The different chips are heated with the different light intensities from the (single) light pulse.

The inventors note that different heating properties of chips may cause the chips to heat differently, e.g. to reach different temperatures, when their respective illuminated areas are exposed to the same (homogeneous) light intensity, in particular by being exposed to a single flash light pulse. Using different light intensities, e.g. power or energy per unit area, may at least partially compensate the different heating properties of the chips to reduce a spread in temperature between the chips as a result of the heating by the light pulse. The different chips may e.g. attain a predetermined temperature in a small temperature range for melting the solder material in contact therewith in a controlled manner. It will be appreciated that the present technique has the advantages of a flash lamp exposure, e.g. being relatively fast being able to expose large areas with multiple components, compatible with flexible foils and roll-to-roll processing due to the pulse duration and intensity. Furthermore, by use of the masking device, the technique can be reliable, e.g. due to improved control over the heating of different chips. The masking device can also be used to prevent exposure of the substrate, e.g. at places between the chips. This may prevent damage to the substrate.

By simultaneously transmitting a single pulse to the chips via a mask pattern of the masking device, multiple chips can be exposed at different intensities. For example the mask pattern comprises filter regions that selectively attenuate different areas of the pulse impinging the mask. Accordingly different intensities in a range up to the original intensity of the light pulse can be achieved. For example a first intensity can be set between ten and ninety percent lower or higher than a second intensity. The masking device may have a variable transmission or reflection across its surface to attenuate or otherwise selectively pass part of the light to the chips. For example, the masking pattern may have a variable transmission, reflection, and/or absorption coefficient.

The masking device can be based on reflection and/or transmission and may comprise e.g. a fixed or variable mask pattern. For example, a variable mask pattern can be achieved by electronic control of (an array of) digital mirrors or other tuneable optics. A variable mask pattern may be formed e.g. by a grid of pixels that can switch their transmission coefficient depending on a control signal. A variable light intensity can e.g. be achieved by setting multiple pixels to the same specific transmission coefficient or by using a combination of pixels with different transmission coefficients combined. Advantageously, a pixelated mask can be used to selectively heat only part of the chip. This can leverage the process by avoiding damaging sensitive part of the chip or enhancing heat flow from (part of) the chip, e.g. close to the solder bumps. For example, a dithered pattern can be formed wherein some pixels completely block the light from reaching the chip (i.e. transmission coefficient zero), while neighbouring pixels pass the light. Also other combinations of patterns and different (non-zero) transmission coefficients are possible.

Accordingly different light intensities suitable for soldering of different chips can be attained. For example a total energy delivered to the chip per pulse can be tuned to a heat capacity of the chip, e.g. determined by its dimensions and/or material composition. For example when a chip is relatively thin, it may be heated faster than a relatively thick chip by the same energy per surface area or light intensity. A chip that has a larger surface area may receive more light from the pulse, but it may also cool down faster via a larger contact area. To calculate the desired light intensity, a heat capacity of the chip can also be normalized with respect to its surface area receiving the light.

By projecting the light pulse onto the chips while they are positioned on the substrate with the solder material there between, the chips can be heated and cause at least partial melting of the solder material for attaching the chips to the substrate. Alternatively, or in addition, chips can also be first provided on a chip carrier substrate before being transferred to the destination substrate. Advantageously, the light pulse can be used for both releasing the chips from the carrier substrate and heating the chips for soldering. For example, chips can be released from the substrate by decomposition or ablation of material of the chip carrier by the heated chip. The chips may also be continuously heated while in mid air between the carrier and destination substrate. The chip can be heated relatively fast while in mid air if it is not contacting a heat sink, such as the substrate, and a relatively high temperature can be achieved. By modulating an intensity of the pulse, it can be adapted to different phases of the transfer, e.g. with less intensity during the transfer in mid air to prevent overheating. Light modulation can e.g. be effected by the masking device and/or control of the flash lamp.

The transfer of chips from a carrier can also be performed without a masking device. Accordingly, another or further aspect of the present disclosure provides a method for soldering a chip to a substrate comprising providing a substrate and a flash lamp with a chip carrier there between. According to the method, one or more chips are attached to the chip carrier on a side of the chip carrier facing the substrate. A flash lamp is provided generating a light pulse for heating the chip. The heating of the chip causes the chip to be released from the chip carrier towards the substrate. Advantageously, the method can provide contactless transfer of one or more chips to a substrate.

Additionally and synergistically, by providing a solder material between the chip and the substrate, the chip can be automatically soldered after the transfer. Additionally and synergistically, by providing a masking device between the flash lamp and carrier, chips having different heating properties can be simultaneously and contactlessly transferred with improved control over the temperature for soldering. The masking device and chip carrier can be separate or integrated, e.g. in a single foil with different transmission properties at different areas where chips are attached. In addition, by using a transparent chip carrier, the chip can be heated by the light pulse transmitted through the chip carrier. The masking device can be placed between the flash lamp and the chip, e.g. for at least partially blocking part of the light pulse from directly irradiating the substrate around the chip or for attenuating the pulse depending on the heating properties of the one or more chips. The masking device may also be integrated as part of the chip carrier, e.g. as a pattern on a flexible foil holding the chips. Alternatively, or in addition, a masking device may be integrated in the destination substrate, e.g. the component is mounted/soldered within an encapsulated device or substrate wherein a transmitting topology of the substrate itself acts as mask pattern.

Aspects of the present disclosure may also be embodied an apparatus for soldering chips having different heating properties to a substrate. The apparatus comprises a substrate handler configured to determine a location of the substrate. A chip location device is configured to determine a location of the chips with respect to the substrate. A flash lamp is configured to deliver a light pulse to the chips for heating the chips. A masking device is disposed in use between the flash lamp and the chips and configured to cause different light intensities in different areas of the light pulse passing the masking device for heating the chips, having different heating properties, with different light intensities. The apparatus can e.g. be used for performing the methods described herein and vice versa. For example a controller can be used to control one or more parts of the apparatus in accordance with the methods described herein. Accordingly, the apparatus can be controlled such that the different light intensities may at least partially compensate the different heating properties of the chips to reduce a spread in temperature between the chips as a result of the heating by the light pulse.

The masking device may e.g. comprise a mask pattern with different filter regions. For example, two, three or more filter regions with different optical properties can be provided for selectively heating two or more chips with different light intensities while at least partially blocking light otherwise radiating the substrate between the chips. For example, different filter regions may comprise different transmission, reflection and/or absorption coefficients. Light may reach the chips e.g. via transmission through the mask or by reflection from the mask. The mask pattern area can e.g. be homogenously illuminated by optional illumination optics between the flash lamp and the mask. The apparatus may also comprise optional projection optics to image the mask pattern onto the chips. Alternatively, the mask can be placed close to the substrate and/or a relatively collimated beam of light is used to project a pattern of the mask without further optics. The projected pattern may comprise e.g. three or more different light intensities, i.e. at least two different intensities for the two different chips and a third intensity for the surrounding substrate.

A chip location device can be configured to determine locations of the chips e.g. relative to the substrate and/or masking device. For example, the chip location device may determine the location by placing the chips in a predetermined or otherwise known location. Alternatively or in addition, a chip sensor, e.g. camera, can be used to detect and determine a location of the chips. Also a size of the chips may be determined at the same time as placement, or by sensor detection, e.g. using a camera. Accordingly, the position and intensity of the light determined by the mask pattern can be controlled depending on the position and size of the chips. A controller may synchronize a location of the chips with intensities of the projected mask pattern. For example, the controller may control the transmission coefficients of the mask filter regions in dependence of the respective sizes of the chips. For example, by setting a relatively lower light intensity for a part of the light pulse intended for a relatively thinner size chip, the chip can be heated to the same temperature as a relatively thicker chip irradiated by a relatively higher light intensity.

For example, chips can be positioned on the substrate by a chip supply unit, such as a pick and place device, with the solder material there between before being illuminated by a light pulse. Alternatively, chips can be placed by illumination a chip carrier foil that releases the chips over the substrate while simultaneously heating the chip for soldering. By additionally using the masking device, chips with different heating properties, e.g. different sizes, can be contactlessly transferred from the carrier to the destination substrate. The masking device and the chip carrier can be separate devices or integrated as a single piece, e.g. comprised in a flexible foil. The chip carrier and/or masking device can be moved in synchronicity with the substrate to place the chips at the intended locations while keeping the substrate moving e.g. in a roll-to-roll process. Alternatively, or in addition, the substrate handler may slow down or stop movement of the substrate while the light is applied to the chips.

The apparatus may comprise a solder supply unit to apply the solder material to the substrate and/or chips before the chips are placed on the substrate with the solder material there between. For example, a blade coating device and/or a stencilling device can be used to apply the solder material, e.g. solder bumps to conductive tracks on the substrate where the chip is to be placed. The apparatus may comprise a track application unit, e.g. printing device to apply conductive tracks to the substrate before the solder material is applied. Alternatively, or in addition the substrate may also be supplied with tracks already formed.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
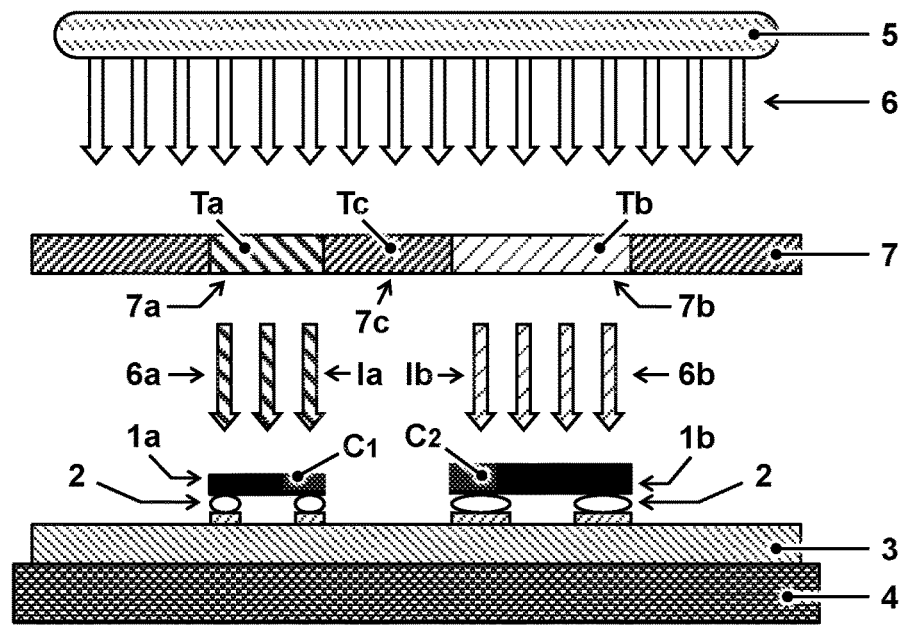
FIGS. 1A and 1B schematically show embodiments for soldering chips onto a substrate.

In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1A schematically shows an embodiment of an apparatus and method for soldering chips 1a and 1b to a substrate 3, wherein the chips 1a and 1b have different heating properties C1 and C2, respectively.

According to one embodiment, the apparatus comprises a substrate handler 4 configured to determine a location of the substrate 3 and/or chips 1a, 1b. In one embodiment, the apparatus comprises a chip location device (not shown here) configured to determine a location of the chips 1a,1b with respect to the substrate 3 In one embodiment, the apparatus comprises a light source 5 configured to deliver a light pulse 6 to the chips 1a,1b for heating the chips 1a,1b. Preferably, millisecond light pulses are used. Most preferably, the light source is a flash lamp, e.g. a (pulsed) xenon flash lamp. A typical pulse may deliver a total energy between 1 and 20 $J/cm^2$ e.g. in a pulse time between 0.5 to 10 ms. For example, a Xenon or other high intensity flash lamp can be used, e.g. with a pulse length of 2 ms and pulse intensity of 10 $J/cm^2$.

A flash lamp, also called flashtube, typically comprises an electric arc lamp configured to produce intense (incoherent) light for short durations, e.g. light pulses having a pulse length between 500 microseconds and 20 milliseconds. Also shorter or longer pulses may be possible. Flashtubes are for example made of a length of glass tubing with electrodes at either end and are filled with a gas that, when triggered, ionizes and conducts a high voltage pulse to produce the light. For example a Xenon flash lamp can be used to produce high light intensities sufficient to irradiate a chip surface and at least partially melt a solder material in contact with the chip e.g. by heat conducted through the chip. In one embodiment, an elliptical or parabolic mirror is used to shape, e.g. collimate, the light pulse.

In one embodiment, the apparatus comprises a masking device 7 disposed in use between the flash lamp 5 and the chips 1a,1b and configured to cause different light intensities Ib,Ib in different areas 6a,6b of the light pulse 6 passing the masking device 7 for heating the chips 1a,1b, having different dimensions, with different light intensities Ia,Ib. For example, the light intensities Ia and Ib differ by at least five percent, at least ten percent, at least twenty percent, at least fifty percent (i.e. one intensity being twice as much as the other), or even more. For example, in one embodiment, a high intensity pulsed xenon flash lamp is used in combination with a (lithographical) mask to pattern the light pulse impinging the chips According to another or further embodiment, the method comprises providing a substrate 3 and two or more chips 1a,1b having different dimensions. A solder material 2 is disposed between the chips 1a,1b and the substrate 3, e.g. previously applied to conductive tracks on the substrate 3. A flash lamp 5 generates a light pulse 6 for heating the chips 1a,1b, wherein the solder material 2 is at least partially melted by contact with the heated chips 1a,1b. In one embodiment, a masking device 7 is disposed between the flash lamp 5 and the chips 1a,1b causing different light intensities Ia,Ib in different areas 6a,6b of the light pulse 6 passing the masking device 7 thereby heating the chips 1a,1b, having different dimensions, with different light intensities Ia,Ib.

The light pulse 6 is simultaneously transmitted to the chips 1a,1b via a mask pattern 7a,7b,7c of the masking device 7. For example, the mask pattern 7a,7b,7c comprises a first filter region 7a passing a first part 6a of the light pulse 6 with a first light intensity Ia to a first chip 1a; and a second filter region 7b passing a second part 6b of the light pulse 6 with a second light intensity Ib to a second chip 1b, wherein the first light intensity Ia is different than the second light intensity Ib. Light intensity is measured e.g. per unit area of the chip surface receiving the part of the light pulse.

In one embodiment, the first chip 1a has a first heat capacity Ca and the second chip 1b has a second heat capacity Cb different from the first heat capacity Ca. For example in the shown embodiment, the first chip 1a is thinner than the second chip 1b. An object's heat capacity is defined e.g. as the ratio of the amount of heat energy transferred to an object and the resulting increase in temperature of the object. Heat capacity may be larger for larger objects or for objects containing a material with larger specific heat capacity (per unit mass) or volumetric heat capacity (per unit volume). Preferably, the different light intensities Ib,Ib at least partially compensate a difference in heat capacity C1,C2 or other difference in heating property between the different chips 1a,1b for reducing a spread in temperature of the chips heated by the light pulse 6.

In one example, two components having different thicknesses and surface areas may need a different input energy for soldering components. For example, a lower thickness and surface may result in a low heat capacity leading to a relatively high temperature increase per input energy unit, while on the contrary a reduced number of solder bonds may require lower input energy for soldering corresponding bonds. Using a mask with corresponding transmittance filters, exposure fluence can be locally tuned allowing for different chips to be soldered with a single pulse. Filters could be for example either with fixed or configurable transmittance.

In one embodiment, the apparatus comprises optional illumination optics (not shown) configured to homogeneously illuminate an area of the masking device 7 with the mask pattern 7a,7b,7c. In another or further embodiment, the apparatus comprises optional projection optics (not shown) configured to project an image of the mask pattern 7a,7b,7c onto the chips 1a,1b. In the embodiment shown, the transmitted light 6a,6b of the light pulse 6 is projected onto the chips 1a,1b while they are positioned on the substrate 3 with the solder material 2 there between thereby heating the chips 1a,1b. The heated chips 1a,1b may cause the at least partial melting of the solder material 2 for attaching the chips 1a,1b to the substrate 3 (after resolidification).

In one embodiment, the masking device 7 comprises a mask pattern 7a,7b,7c configured to selectively transmit the light pulse 6 to the chips 1a,1b. In another or further embodiment, the mask pattern 7a,7b,7c comprises a first filter region 7a having a first transmission coefficient Ta configured to transmit light 6a of the light pulse 6 with a first light intensity Ia to a first chip 1a for melting a solder material 2 between the first chip 1a and the substrate 3; and a second filter region 7b having a second transmission coefficient Tb configured to transmit light 6b of the light pulse 6 with a second light intensity Ib to a second chip 1b for melting a solder material 2 between the second chip 1a and the substrate 3. In a further embodiment, the first transmission coefficient Ta is different than the second transmission coefficient Tb for simultaneously irradiating the chips 1a,1b with different light intensities Ib,Ib. The transmission coefficient is a measure of how much of an electromagnetic wave (light) passes a surface or an optical element. For example, transmission coefficients can be calculated for either the amplitude or the intensity of the wave. Either is calculated by taking the ratio of the value after the surface or element to the value before.

In one embodiment, the filter regions 7a,7b,7c of the mask pattern are controllable to tune the transmission coefficients Ta,Tb. For example, the mask pattern 7a,7b,7c is formed by tunable optics, e.g. a grid of digital mirrors, and/or polarizing optics. In one embodiment, the mask pattern 7a,7b,7c comprises a third filter region 7c having a third transmission coefficient Tc configured to substantially block part of the light pulse 6, e.g. a part that would otherwise be directly projected onto the substrate 3.

In one embodiment, the masking device 7 comprises photolithographed metal on glass. For example, aluminium or chrome is used to vary the light intensity of the pulse in two, three, or more different intensities. In one embodiment, the masking device 7 comprises a cooling device (not shown), e.g. water cooling to handle (partial) absorption of high energy light pulses.

Figure 1B:
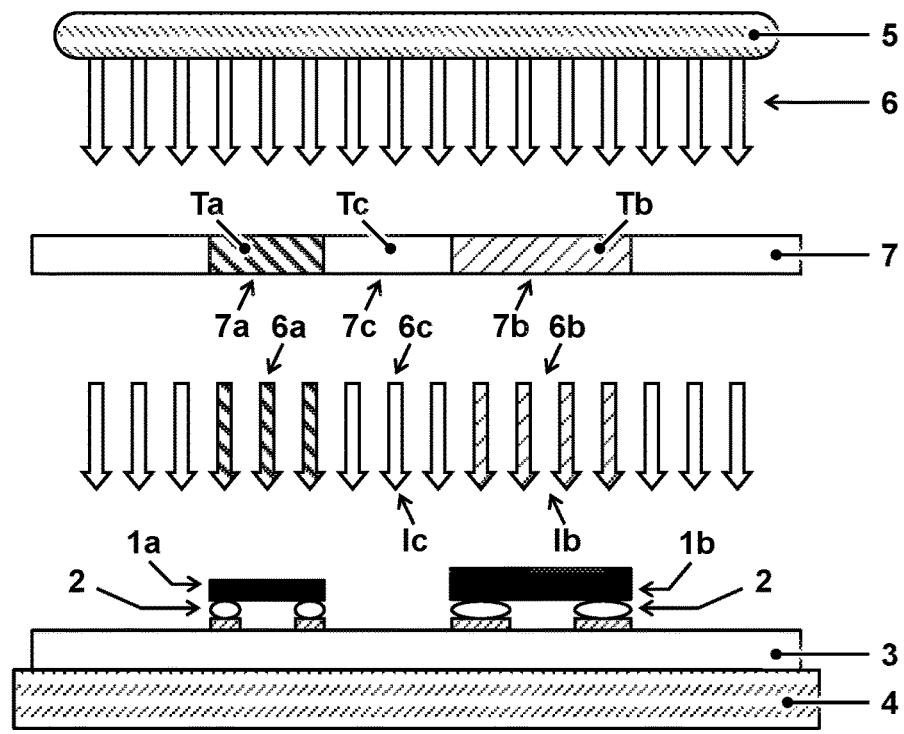

FIG. 1B shows an embodiment similar to FIG. 1A, but wherein light 6c of the light pulse 6 is transmitted with a third light intensity Ic to the substrate 3. In one embodiment, the third light intensity Ic is different from the first and second light intensities Ia,Ib, e.g. to also control heating of the substrate independent from heating of the chips. By additional heating of the substrate between the chips, the effects of local heating only at the positions of the chips can be alleviated. Alternatively, or in addition, the substrate 3 and or substrate handler 4 can be at least partially transparent to the light 6c so the effects of heating the substrate can be limited.

Figure 2A:
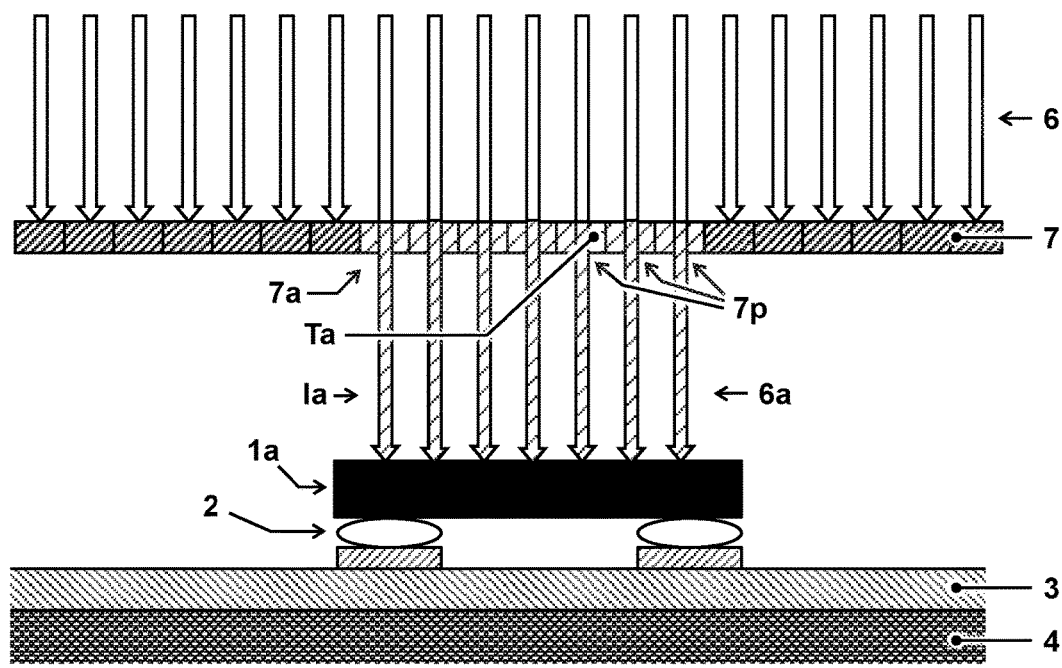
FIGS. 2A and 2B schematically show embodiments for soldering a chip through a pixelated mask.

FIG. 2A shows an apparatus for soldering a chip 1*a* onto a substrate 3, wherein the masking device 7 comprises a first filter region 7*a* with pixels 7*p* having a first transmission coefficient Ta to transmit light 6*a* of the light pulse 6 with the first light intensity Ia to the first chip 1*a*.

Figure 2B:
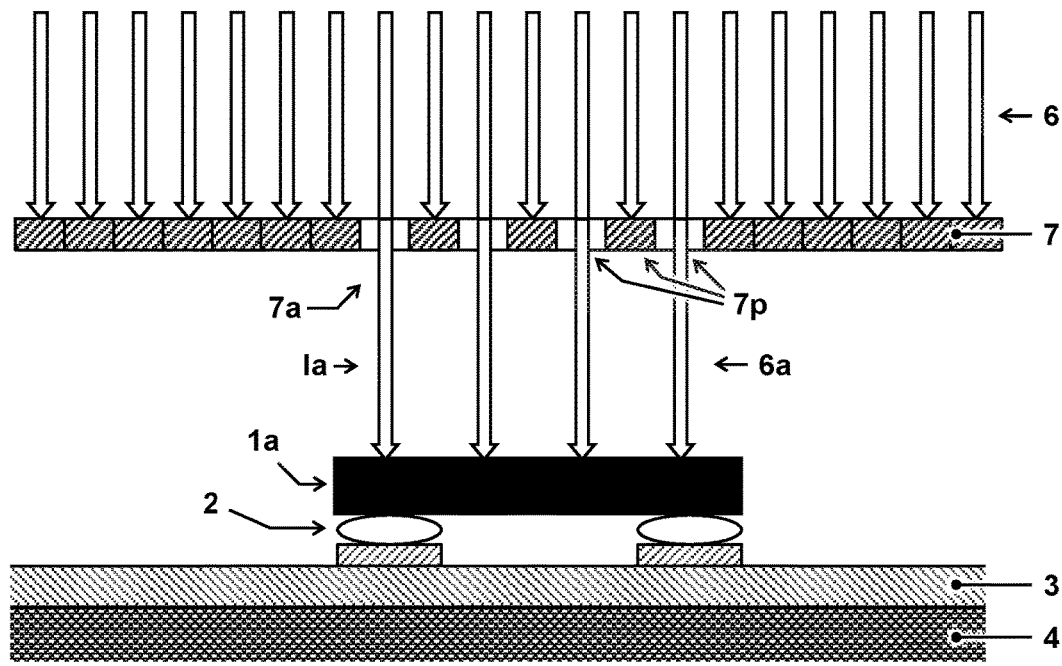

FIG. 2B shows an apparatus for soldering a chip 1*a* onto a substrate 3, wherein a filter region 7*a* transmitting part 6*a* of the light pulse 6 to a chip 1*a* comprises multiple pixels 7*p* having different transmission coefficients, wherein the first light intensity Ia is determined by a combination light intensities transmitted by the pixels 7*p* having different transmission coefficients. For example, a dithered pattern of pixels can be used to reduce the overall or average intensity Ia of light 6*a* impinging the chip 1*a*.

FIG. 3 schematically illustrates another or further embodiment for soldering chips 1*a*,1*b* to a substrate 3.

According to the embodiment, a chip carrier 8 is configured to releasable carry the chips 1*a*,1*b*. In use, the chip carrier 8 is disposed between the flash lamp 5 and the substrate 3. The chips 1*a*,1*b* are carried by the chip carrier 8 over the substrate 3 before being positioned on the substrate 3. The light 6*a*,6*b* of the light pulse 6 transmitted by the masking device 7 is projected onto the chips 6*a*,6*b* held by the chip carrier 8 thereby heating the chips 1*a*,1*b*. The chips 6*a*,6*b* are released from the chip carrier 8 by the heating and transferred to the substrate 3 resulting in the configuration shown in FIG. 3B. Similar as described e.g. with reference to FIG. 1, the heated chips 1*a*,1*b* cause the at least partial melting of the solder material 2 between the chips 1*a*,1*b* and the substrate 3 for attaching the chips 1*a*,1*b* to the substrate 3.

In one embodiment, the transmitted light 6*a*,6*b* of the light pulse 6 causes decomposition e.g. ablation of material between the chip carrier 8 and the chips 1*a*,1*b* thereby releasing the chips 1*a*,1*b* from the chip carrier 8. In another or further embodiment, the transmitted light 6*a*,6*b* of the light pulse 6 continues to irradiate the chips 1*a*,1*b* while they are in transit over a distance between the chip carrier 8 and the substrate 3. In another or further embodiment, the transmitted light 6*a*,6*b* of the light pulse 6 continues to irradiate the chips 1*a*,1*b* when they are positioned on the substrate 3 with the solder material 2 there between.

In one embodiment, the chip carrier 8 comprises transparent polymer films or a transparent glass substrate with a sacrificial adhesion layer. For example, the chip carrier 8 comprises so-called "standardized (blue) transparent polymer film" on which the silicon wafer is typically placed. This means that in principle the manufacturer of these cut wafers does not have to change their processing. Also other chip carrier substrates can be used, e.g. so-called "purple adhesive tape". In one embodiment, thin (e.g. silicon) chips of less than 50 microns thick are used to facilitate heat transport from the top to the base in order to solder.

Figure 3A:
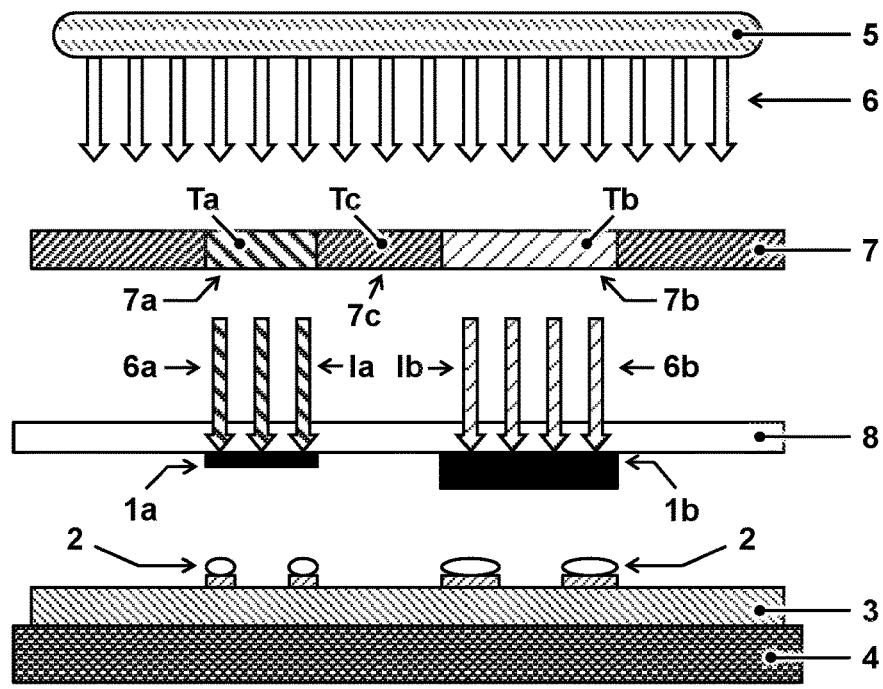
FIGS. 3A and 3B schematically show two steps of an embodiment for chip transfer and soldering including a mask.
Figure 3B:
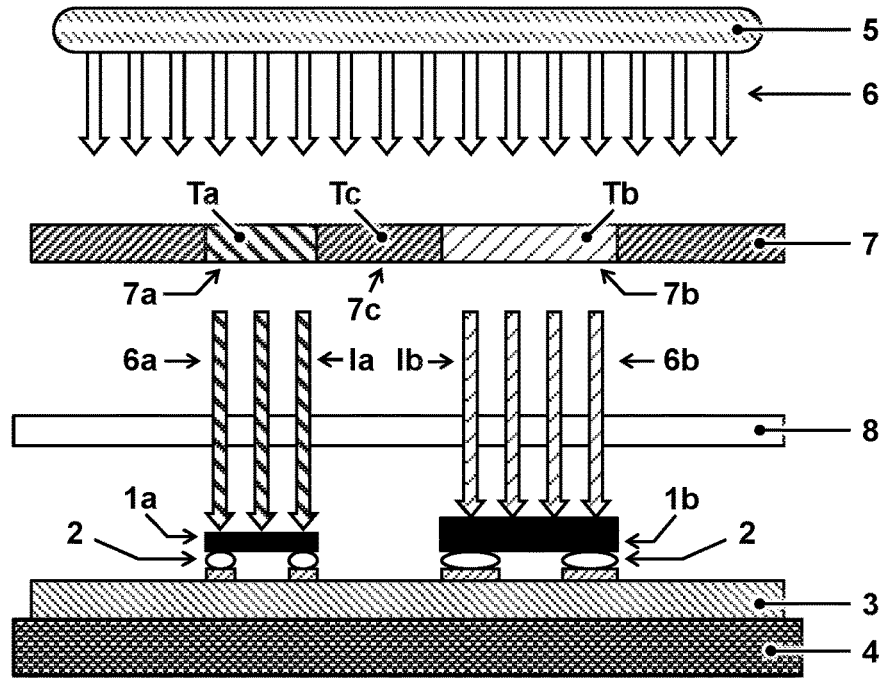
Figure 4A:
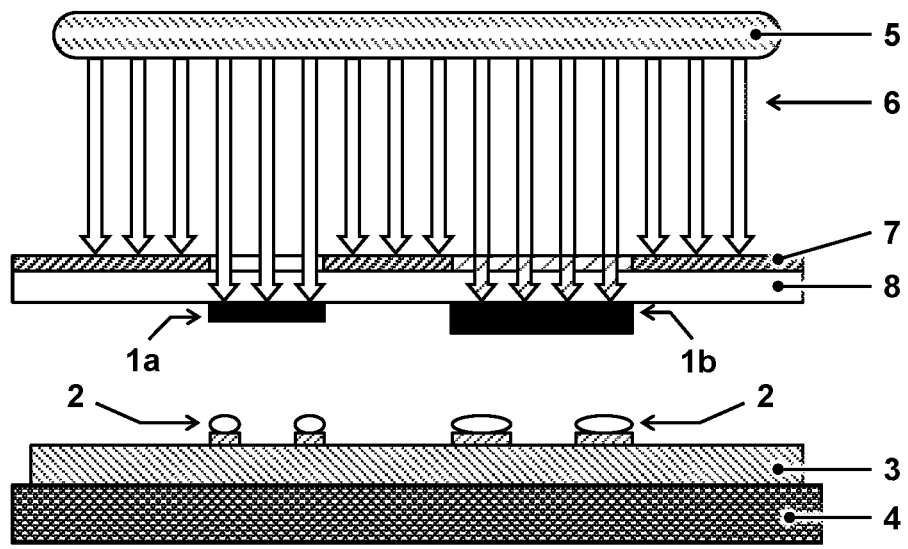
FIGS. 4A and 4B are similar to FIG. 3, wherein the chip carrier and mask are of a single piece.
Figure 4B:
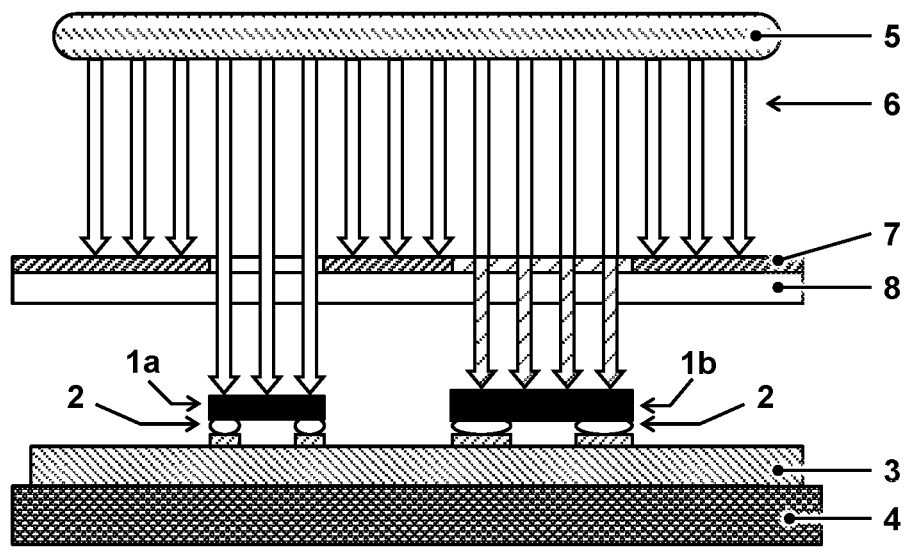

FIGS. 4A and 4B schematically illustrate another embodiment, similar to FIGS. 3A and 3B, but wherein the masking device 7 and the chip carrier 8 are integrated as a single piece. For example, as shown, the masking device 7 may be formed by a layer on top of the chip carrier 8. In one embodiment, the chip carrier 8 and/or masking device 7 are comprised in a flexible foil, e.g. having variable transmission for different areas where chips are attached.

Figure 5A:
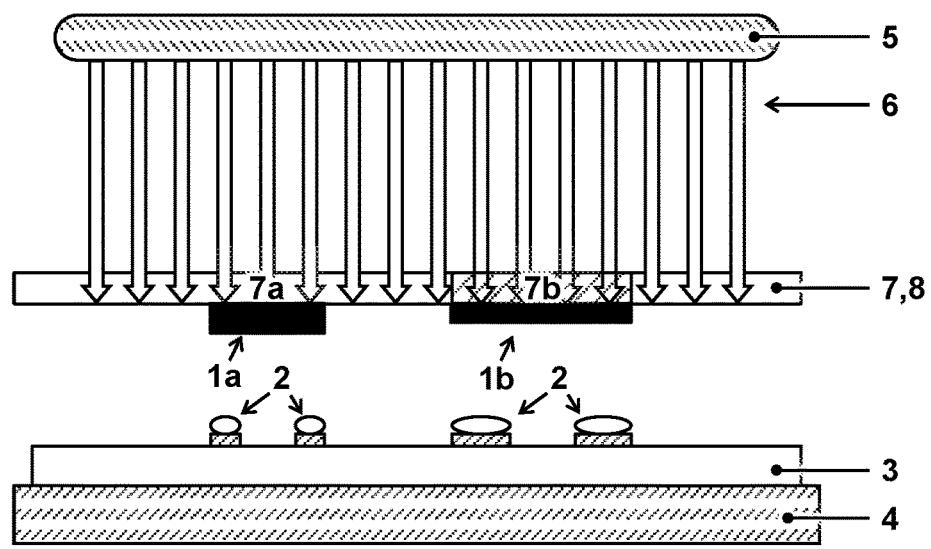
FIGS. 5A and 5B are similar to FIGS. 3 and 4, wherein the chip carrier and mask are further integrated.
Figure 5B:
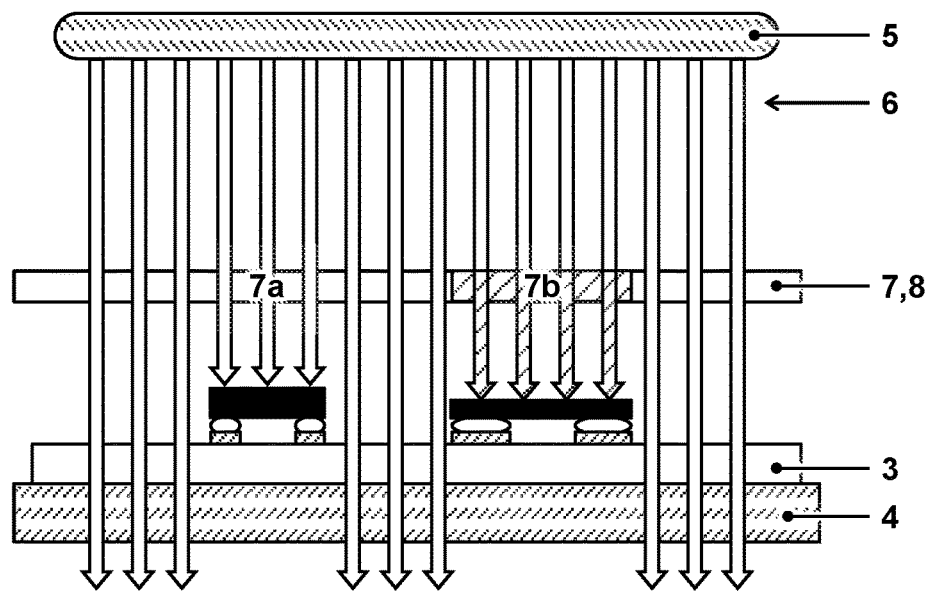

FIGS. 5A and 5B schematically illustrate another embodiment similar to FIGS. 4A and 4B, but wherein the filter regions 7*a* and 7*b* of the masking device 7 are integrated in the layer forming the carrier substrate 8. In one embodiment, the masking device 7 comprises a transparent foil with a less transparent area 7*b* where a chip 1*b* is attached. For example, the area 7*a* may transparent for providing the full intensity of the pulse to a first chip 7*a*, and the area 7*b* may be partially opaque or semi-transparent for attenuating light of the pulse 6 impinging the second chip, e.g. having a lower heat capacity per illuminated area.

Figure 6A:
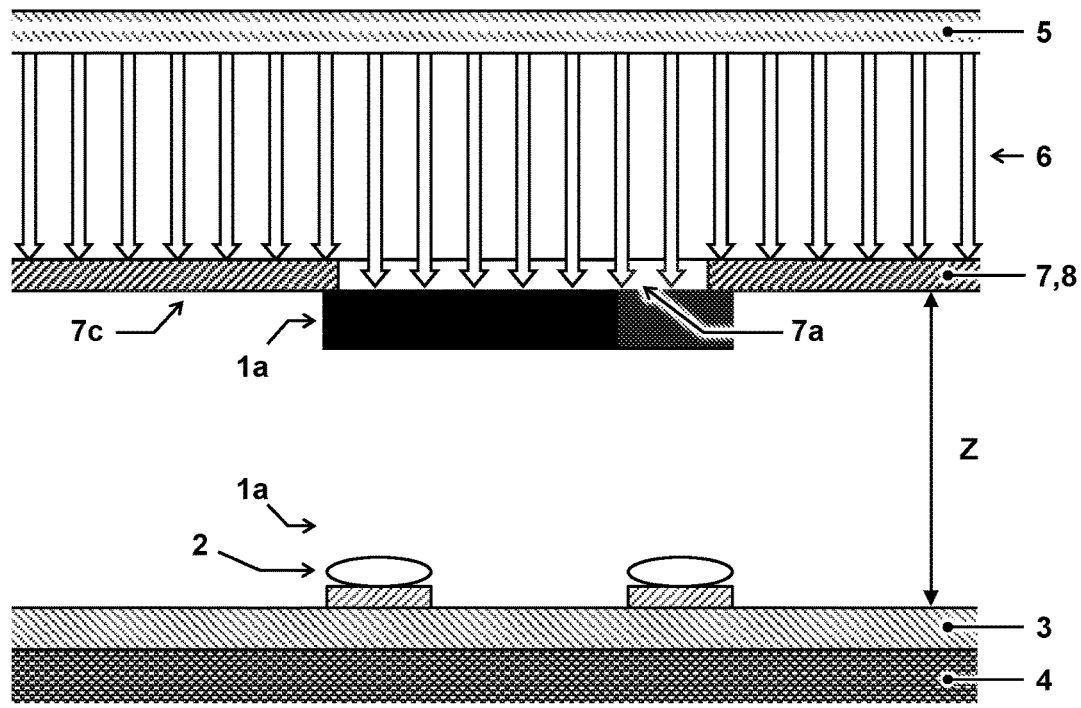
FIGS. 6A and 6B schematically show two steps of an embodiment for chip transfer and soldering FIGS. 7A and 7B schematically show embodiments for stages of soldering chips onto a substrate using a roll-to-roll process.
Figure 6B:
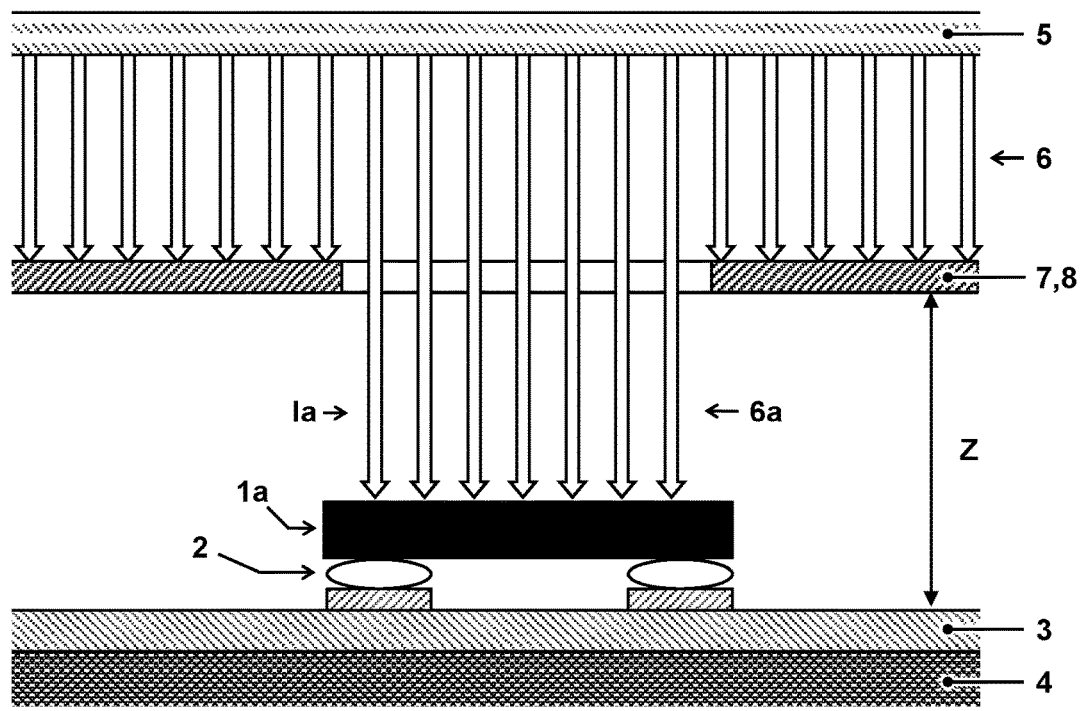

FIGS. 6A and 6B schematically illustrate a method for soldering a chip 1*a* to a substrate 3. The method comprises providing a substrate 3 and a flash lamp 5 with a chip carrier 8 there between. One or more chips 1*a* are attached to the chip carrier 8 on a side of the chip carrier 8 facing the substrate 3. The method comprises providing a flash lamp 5 generating a light pulse 6 for heating the chip 1*a*. The heating of the chip 1*a* causes the chip 1*a* to be released from the chip carrier 8 towards the substrate 3.

In one embodiment, a solder material 2 is provided between the chip 1*a* and the substrate 3, wherein the solder material 2 is at least partially melted by contact with the heated chip 1*a* for attaching the chip 1*a* to the substrate 3. For example, solder material can be applied to an electrical tracks on the substrate, to the chip, or both. In one embodiment, as shown, the chip 1*a* is heated by the light pulse 6 transmitted through the chip carrier 8. For example, the chip carrier 8 comprises a carrier substrate that is transparent to the light pulse 6.

In one embodiment, the transmitted light 6*a* of the light pulse 6 through the chip carrier 8 causes decomposition of material between the chip carrier 8 and the chip 1*a* thereby releasing the chip 1*a* from the chip carrier 8. In one embodiment, the transmitted light 6*a* of the light pulse 6 continues to irradiate the chip 1*a* while it is in transit over a distance Z between the chip carrier 8 and the substrate 3.

In one embodiment, the chip 1*a* is at least partially transferred by and/or along a gravitational direction towards the substrate 3. Alternatively, or in addition, the release from the chip carrier 8 may cause the chip 1*a* to have an initial velocity towards the substrate 3. E.g. decomposition of the material of the chip carrier 8 may cause gas formation that launches the chip 1*a*.

In one embodiment, the chip 1*a* is at a distance Z of at least 50 micrometer, preferably at least 100 micrometer from the substrate 3. At closer distances, the chips may start accidentally contacting the substrate 3 before being transferred. In another or further embodiment, the chip 1*a* is at a distance Z of at most one millimeter, preferably at most 500 micrometer from the substrate 3. At larger distances, control over the positioning of the chip may deteriorate. For example, a gap between the chip and the destination substrate (including any conducting tracks and/or solder bumps) is at 125 micrometer. This may provide alignment accuracy of about 10 microns. For example, the substrate 3 comprises a polyimide with eighteen micron thick copper tracks and solder bumps. Also other distances are possible, depending on the desired amount of control over the positioning of the chip. The distance Z can be measured between the facing surfaces of the substrates 3 and 8 or, alternatively, between the facing surface of the (thickest) chip and the contact points on the substrate 3, including any solder material there between. In the latter case the distance Z is a measure of the distance that the chip can travel between the carrier and the destination substrate.

In one embodiment, a masking device 7 is disposed between the flash lamp 5 and the chip 1*a* at least partially blocking part of the light pulse 6 from directly irradiating the substrate 3 around the chip. The masking device may be integrated in the chip carrier substrate 8, as shown in this figure, or separate there from.

In one embodiment, the transmitted light 6a of the light pulse 6 continues to irradiate the chips 1a when it is positioned on the substrate 3 with the solder material 2 there between. In one embodiment, the light 6a of the light pulse 6 is modulated as a function of time. In another or further embodiment, light modulation is caused by the masking device 7 and/or flash lamp 5. In another or further embodiment, the light intensity of the light 6a is higher at a moment when the chip is released from the chip carrier 8 than during a time of transit of the chip 1a between the chip carrier 8 and the substrate 3. In another or further embodiment, the light intensity of the light 6a is higher at a moment when the chip contacts the solder material 2 than during a time of transit of the chip 1a between the chip carrier 8 and the substrate 3. In another or further embodiment, the light intensity of the light 6a is higher at a moment when the chip is released from the chip carrier 8 than at a moment when the chip contacts the solder material 2 on the substrate 3.

Figure 7A:
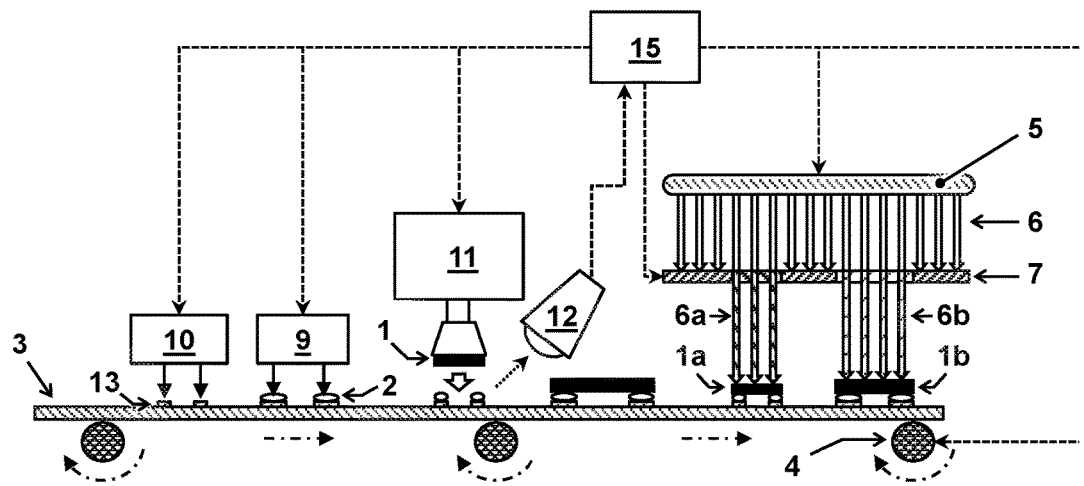

FIG. 7A illustrates an embodiment of an apparatus for soldering of chips in a roll-to-roll fabrication process. In the embodiment, the substrate handler 4 comprises rolls to handle the foil substrate 3 which may be flexible. For example the substrate may comprise a polymer foil, e.g. comprising PET or other polyester.

In one embodiment, the apparatus comprises a controller 15 configured to variably tune the light intensities Ia,Ib in dependence of the respective sizes of the chips 1a,1b. In one embodiment, a controller 15 is configured to determine locations of the chips 1a,1b from a chip location device 11 and to control the c hip location device 11, masking device 7, and/or substrate handler 4. In another or further embodiment, the controller 15 is programmed to align the different light intensities Ia,Ib of the different areas 6a,6b of the light pulse 6 with locations of the different chips 1a,1b. For example, the controller 15 is configured to control the transmission coefficients Ta,Tb of the filter regions 7a,7b in dependence of the respective sizes of the chips 1a,1b.

In one embodiment, the controller 15 is programmed to set a relatively high light intensity Ib for a part 6b of the light pulse 6 intended for a chip 1b having a relatively high heat capacity per illuminated area, e.g. a relatively thick chip. In another or further embodiment, the controller 15 is programmed to set a relatively low light intensity Ia for a part 6a of the light pulse 6 intended for a chip 1a having a relatively low heat capacity per illuminated area, e.g. a relatively thin chip. For example if all dimensions of a chip are enlarged, the received amount of light may increase quadratically with a (top) surface area of the chip while the heat capacity may increase to the third power with a volume of the chip. In one embodiment, the controller 15 is programmed to set a relatively higher transmission coefficient Tb for a part 6b of the light pulse 6 intended for a relatively larger size chip 1b and a relatively lower transmission coefficient Ta for a part 6a of the light pulse 6 intended for a relatively smaller size chip 1a.

In one embodiment, the substrate handler 4 is configured to slow down or stop movement of the substrate 3 while the light 6a,6b is applied to the chips 1a,1b.

In one embodiment, the chip location device comprises a chip supply unit 11 configured to supply the chips 1a,1b before they are soldered to the substrate 3. In another or further embodiment, the chip supply unit 11 comprises a pick and place device configured to place the chips 1 onto the substrate 3. Also other chip placement devices can be used.

In one embodiment, the chip location device comprises a chip sensor 12 configured to detect a location and/or size of the chips 1a,1b on the substrate 3. In another or further embodiment, the chip sensor 12 comprises a camera. Also other sensors can be used.

In one embodiment, the apparatus comprises a solder supply unit 9 configured to apply the solder material 2 to the substrate 3 and/or chips 1a,1b before the chips 1a,1b are placed on the substrate 3 with the solder material 2 there between. For example, the solder supply unit 9 comprises a blade coating device and/or a stencilling device.

In one embodiment, the apparatus comprises a track application unit 10 configured to apply, e.g. print, conductive tracks to the substrate 3 before the solder material 2 is applied, wherein, in use, the chips 1a,1b are electrically connected to the tracks.

Figure 7B:
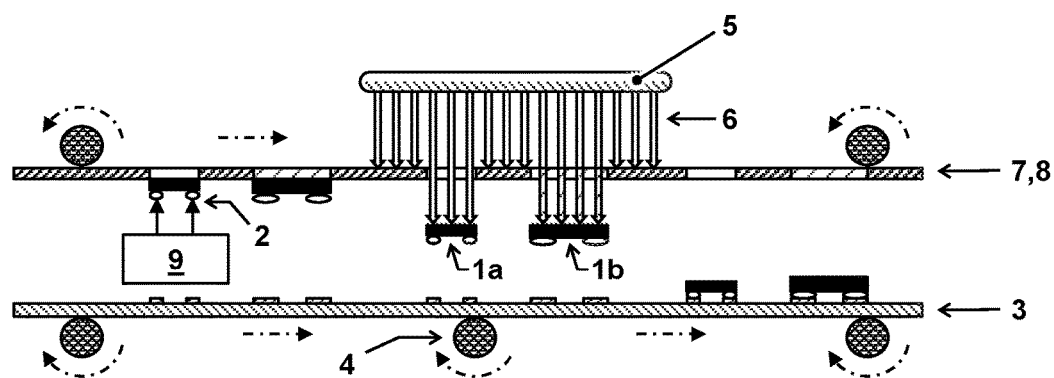

FIG. 7B illustrates an embodiment of an apparatus for soldering of chips in a roll to roll fabrication process comprising a chip carrier 8 for delivering the chips to the substrate. In one embodiment, wherein the chip carrier 8 and/or masking device 7 are comprised in a flexible foil. In one embodiment, the chip carrier 8 and/or masking device 7 are configured to move in synchronicity with the substrate 3. In one embodiment, the flash lamp 5 is configured to deliver a single pulse 6 to transfer and solder multiple chips 1a, 1b having possibly different sizes or other heating properties.

For the purpose of clarity and a concise description, features are described herein as part of the same or separate embodiments, however, it will be appreciated that the scope of the invention may include embodiments having combinations of all or some of the features described. For example, it will be clear that the devices described with reference to FIGS. 7A and 7B can also be used in other embodiments than roll-to-roll processing. For example, the controller 15 can also be used to control placement of chips on a fixed substrate Also the other devices 10, 9, 11, 12 as described herein can be applied in other embodiments, alone or in any combination, possibly under separate or shared control of a controller 15 as described herein. The controller may be programmed with software that allow it to execute operational steps in accordance with methods as described herein with reference to any of the embodiments.

Also other combinations will be readily apparent to the skilled artisan having the benefit of the present disclosure for achieving a similar function and result. For example electronic and mechanical components may be combined or split up into one or more alternative components. The various elements of the embodiments as discussed and shown offer certain advantages, such as fast and reliable soldering of chips and/or contactless transfer of chip. Of course, it is to be appreciated that any one of the above embodiments or processes may be combined with one or more other embodiments or processes to provide even further improvements in finding and matching designs and advantages. It is appreciated that this disclosure offers particular advantages to roll-to-roll processing, and in general can be applied for any application wherein chips are soldered.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A method for soldering chips to a substrate, the method comprising:
   providing a substrate and two or more different chips having different heating properties, wherein a solder material is disposed between each of the two or more different chips and the substrate;
   providing a flash lamp generating a light pulse for heating the two or more different chips, wherein the solder material is at least partially melted by contact with the two or more different chips heated by light pulses from the flash lamp;
   wherein a masking device is disposed between the flash lamp and the two or more different chips to cause different light intensities in different areas of the light pulse passing the masking device, and thereby heating individual ones of the two or more different chips with different light intensities,
   wherein the different light intensities at least partially compensate the different heating properties to reduce a spread in temperature of the two or more different chips as a result of heating by the light pulses from the flash lamp.

2. The method according to claim 1, wherein the masking device comprises a mask pattern configured to selectively transmit the light pulse to the two or more chips, wherein the mask pattern comprises:
   a first filter region having a first transmission coefficient configured to transmit light of the light pulse with a first light intensity to a first chip, of the two or more different chips, for melting a solder material between the first chip and the substrate; and
   a second filter region having a second transmission coefficient configured to transmit light of the light pulse with a second light intensity to a second chip, of the two or more different chips, for melting a solder material between the second chip and the substrate,
   wherein the first transmission coefficient differs from the second transmission coefficient for simultaneously irradiating the two or more different chips, by the light pulse from the flash lamp, with different light intensities.

3. The method according to claim 1, wherein the transmitted light of the light pulse is projected onto the two or more different chips while the two or more different chips are positioned on the substrate with the solder material there between thereby heating the two or more different chips, wherein the heating the two or more different chips causes the at least partial melting of the solder material for attaching the two or more different chips to the substrate.

4. The method according to claim 1, further comprising providing a chip carrier configured to releasably carry the two or more different chips,
   wherein the chip carrier is disposed between the flash lamp and the substrate,
   wherein the two or more different chips are carried by the chip carrier over the substrate before being positioned on the substrate,
   wherein the light of the light pulse transmitted by the masking device is projected onto the two or more different chips held by the chip carrier thereby heating the two or more different chips, and
   wherein the two or more different chips are released from the chip carrier by the heating and transferred to the substrate, wherein the heating of the two or more different chips causes the at least partial melting of the solder material between the two or more different chips and the substrate for attaching the two or more different chips to the substrate.

5. The method according to claim 4, wherein the transmitted light of the light pulse causes decomposition of material between the chip carrier and the two or more different chips thereby releasing the chips from the chip carrier;
   wherein the transmitted light of the light pulse continues to irradiate the two or more different chips while the two or more different chips are in transit over a distance between the chip carrier and the substrate; and
   wherein the transmitted light of the light pulse continues to irradiate the two or more different chips when two or more different chips are positioned on the substrate with the solder material there between.

6. The method according to claim 1, wherein the substrate comprises a flexible foil, and wherein a substrate handler comprises rolls to handle the flexible foil.

7. An apparatus for simultaneously soldering two or more different chips having different heating properties to a substrate, the apparatus comprising:
   a substrate handler configured to determine a location of the substrate;
   a chip location device configured to determine a location of the two or more different chips with respect to the substrate;
   a flash lamp configured to deliver a light pulse to the two or more different chips for heating the two or more different chips;
   a masking device disposed between the flash lamp and the two or more different chips,
   wherein the masking device is configured to cause different light intensities in different areas of the light pulse passing the masking device, and thereby heating individual ones of the two or more different chips with different light intensities.

8. The apparatus according to claim 7, wherein the masking device comprises a mask pattern configured to selectively transmit the light pulse to the chips, wherein the mask pattern comprises:
   a first filter region having a first transmission coefficient configured to transmit light of the light pulse with a first light intensity to a first chip, of the two or more different chips, for melting a solder material between the first chip and the substrate; and
   a second filter region having a second transmission coefficient configured to transmit light of the light pulse with a second light intensity to a second chip, of the two or more different chips, for melting a solder material between the second chip and the substrate,
   wherein the first transmission coefficient differs from the second transmission coefficient for simultaneously irradiating the two or more different chips, by the light pulse from the flash lamp, with different light intensities.

9. The apparatus according to claim 8, wherein the mask pattern comprises a third filter region having a third transmission coefficient configured to block part of the light pulse or transmit light of the light pulse with a third light intensity that differs from the first light intensity and the second light intensity.

10. The apparatus according to claim 7, further comprising a controller configured to variably tune the light intensities in dependence on respective sizes of the two or more different chips.

11. The apparatus according to claim 7, further comprising a controller configured to control the chip location device, masking device, and/or substrate handler, and programmed to align the different light intensities of the different areas of the light pulse with locations of the two or more different chips.

12. The apparatus according to claim 7, further comprising a controller programmed to set:
   a relatively lower light intensity for a first part of the light pulse intended for a first chip having a relatively low heat capacity per illuminated area of the first chip, and
   a relatively higher light intensity for a second part of the light pulse intended for a second chip having a relatively high heat capacity per illuminated area of the second chip.

13. The apparatus according to claim 7, further comprising a chip carrier configured to releasable carry the two or more different chips,
   wherein the chip carrier is disposed between the flash lamp and the substrate,
   wherein the two or more different chips are carried by the chip carrier over the substrate before being positioned on the substrate,
   wherein, in use, light of the light pulse transmitted by the masking device is projected onto the two or more different chips held by the chip carrier for heating the chips,
   wherein the chips are released from the chip carrier by the heating and transferred to the substrate, and
   wherein the heating of the two or more different chips causes melting of the solder material between the two or more different chips and the substrate for attaching the chips to the substrate.

14. The apparatus according to claim 13, wherein the masking device and the chip carrier are integrated as a single piece.

15. The apparatus according to claim 7, wherein the masking device is integrated in the substrate.

* * * * *